(12) United States Patent
Lee et al.

(10) Patent No.: US 7,216,309 B2
(45) Date of Patent: May 8, 2007

(54) METHOD AND APPARATUS FOR MODEL-ORDER REDUCTION AND SENSITIVITY ANALYSIS

(75) Inventors: Herng-Jer Lee, Tao-Yuan (TW); Chia-Chi Chu, Tao-Yuan (TW); Wu-Shiung Feng, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 258 days.

(21) Appl. No.: 10/839,953

(22) Filed: May 6, 2004

(65) Prior Publication Data

US 2004/0261042 A1    Dec. 23, 2004

(30) Foreign Application Priority Data

Jun. 17, 2003    (TW) .............................. 92116650 A

(51) Int. Cl.
 *G06F 17/50*    (2006.01)
 *G06F 19/00*    (2006.01)
 *G06F 17/16*    (2006.01)
 *G06F 17/17*    (2006.01)

(52) U.S. Cl. ...................... 716/2; 716/3; 716/4; 703/2; 703/16

(58) Field of Classification Search .................... 716/2, 716/3, 4; 703/2, 16
See application file for complete search history.

(56) References Cited

U.S. PATENT DOCUMENTS

| | | | | |
|---|---|---|---|---|
| 5,313,398 A | * | 5/1994 | Rohrer et al. ................ 703/14 |
| 5,379,231 A | * | 1/1995 | Pillage et al. ................. 703/14 |
| 5,537,329 A | * | 7/1996 | Feldmann et al. ............. 716/4 |
| 5,625,578 A | * | 4/1997 | Du Cloux et al. .............. 703/2 |
| 5,689,685 A | * | 11/1997 | Feldmann et al. ............. 703/2 |
| 5,920,484 A | * | 7/1999 | Nguyen et al. ................ 703/2 |
| 6,023,573 A | * | 2/2000 | Bai et al. ........................ 703/2 |
| 6,038,389 A | * | 3/2000 | Rahon et al. ................. 703/10 |
| 6,041,170 A | * | 3/2000 | Feldmann et al. ............. 703/2 |
| 6,151,698 A | * | 11/2000 | Telichevesky et al. ......... 716/1 |
| 6,308,304 B1 | * | 10/2001 | Devgan et al. ................ 716/5 |
| 6,349,272 B1 | * | 2/2002 | Phillips ......................... 703/2 |

(Continued)

OTHER PUBLICATIONS

Gad et al., "Model Order Reduction of Nonuniform Transmission Lines Using Integrated Congruence Transform", 2003 Proceedings of Design Automation Conference, Jun. 2, 2003, pp. 238-243.*
Odabasioglu et al., "Practical Considerations for Passive Reduction of RLC Circuits", 1999 IEEE/ACM International Conference on Computer-Aided Design, Nov. 7, 1999, pp. 214-219.*
Freund, "Passive Reduced-Order Models for Interconnect Simulation and Their Computation Via Krylov-subspace Algorithms", 1999 Proceedings of 36th Design Automation Conference, Jun. 21, 1999, pp. 195-200.*

(Continued)

*Primary Examiner*—Phallaka Kik
(74) *Attorney, Agent, or Firm*—Alan D. Kamrath; Nikolai & Mersereau, P.A.

(57) ABSTRACT

Computer time for modeling VLSI interconnection circuits is reduced by using symmetric properties of modified nodal analysis formulation. The modeling uses modified nodal analysis matrices then applies a Krylov subspace matrix to construct a congruence transformation matrix to generate the reduced order model of the VLSI.

9 Claims, 4 Drawing Sheets

U.S. PATENT DOCUMENTS

| | | | |
|---|---|---|---|
| 6,360,190 B1 * | 3/2002 | Kumashiro | 703/2 |
| 6,493,849 B1 * | 12/2002 | Telichevesky et al. | 716/4 |
| 6,513,001 B1 * | 1/2003 | Kapur et al. | 703/13 |
| 6,536,026 B2 * | 3/2003 | Gullapalli | 716/6 |
| 6,662,149 B1 * | 12/2003 | Devgan et al. | 703/14 |
| 6,687,658 B1 * | 2/2004 | Roychowdhury | 703/2 |
| 6,789,237 B1 * | 9/2004 | Ismail | 716/4 |
| 6,810,370 B1 * | 10/2004 | Watts, III | 703/10 |
| 6,810,506 B1 * | 10/2004 | Levy | 716/2 |
| 6,871,167 B1 * | 3/2005 | Kapur et al. | 703/2 |
| 7,035,782 B2 * | 4/2006 | Yang et al. | 703/14 |
| 2003/0009732 A1 * | 1/2003 | Gullapalli | 716/6 |
| 2003/0144824 A1 * | 7/2003 | Yang et al. | 703/14 |
| 2003/0172358 A1 * | 9/2003 | Alon et al. | 716/1 |
| 2004/0010400 A1 * | 1/2004 | Canning | 703/2 |
| 2004/0078174 A1 * | 4/2004 | Canning | 703/2 |
| 2005/0021319 A1 * | 1/2005 | Li et al. | 703/2 |
| 2005/0096888 A1 * | 5/2005 | Ismail | 703/2 |
| 2005/0114098 A1 * | 5/2005 | Nagahara | 703/2 |
| 2006/0195306 A1 * | 8/2006 | Canning | 703/2 |

OTHER PUBLICATIONS

Cao et al., "HiPRIME: Hierarchical and Passivity Reserved Interconnect Macromodeling Engine for RLKC Power Delivery", 2002 Proceedings of 39th Design Automation Conference, Jun. 10, 2002, pp. 379-384.*

Liu et al., "Model Order-Reduction of RC(L) Interconnect Including Variation Analysis", 1999 Proceedings of 36th Design Automation Conference, Jun. 21, 1999, pp. 201-206.*

Heydari et al., "Model Reduction of Variable-Geometry Interconnects Using Variational Spectrally-Weighted Balanced Truncation", IEEE/ACM International Conference on Computer Aided Design, Nov. 4, 2001, pp. 586-591.*

Sheehan, "Projective Convolution: RLC Model-Order Reduction Using the Impulse Response", 1999 Proceedings of Design, Automation and Test in Europe Conference and Exhibition, Mar. 9, 1999, pp. 669-673.*

* cited by examiner

METHOD AND APPARATUS FOR MODEL-ORDER REDUCTION AND SENSITIVITY ANALYSIS

BACKGROUND OF THE INVENTION

1. Field of the Invention

The present invention relates to methods of model-order reduction and sensitivity analysis for VLSI interconnect circuits, and more particularly to a method of one-sided projection.

2. Description of Related Art

With considering the issues of the signal integrity in high-speed VLSI designs, interconnects are often modeled as lumped RLC networks. To analyze an RLC linear network, the modified nodal analysis (MNA) can be used as follows:

$$M\frac{dx(t)}{dt} = -Nx(t) + Bu(t) \qquad (1)$$
$$y(t) = D^T x(t),$$

where $M, N \in R^{n \times n}, x, B \in R^{n \times m}, D \in R^{n \times p}$ and $y \in R^{p \times m}$. Matrices M and N containing capacitances, inductances, conductances and resistances are positive definite. The state matrix x(t) contains node voltages and branch currents of inductors, and u(t) and y(t) represent inputs and outputs. The adjoint equation associated with the system in Eq. (1) is of the form $$M\frac{dx_a(t)}{dt} = -Nx_a(t) + Du(t), \qquad (2)$$

which is the modified node equation of the adjoint network (or the dual system). If the m-port transfer functions are concerned, then p=m and D=B. The transfer functions of the state variables and of the outputs are $X(s)=(N+sM)^{-1}B$ and $Y(s)=B^T X(s)$. Conversely, those of the corresponding adjoint network are given as $$X_a(s)=(N^T+sM)^{-1}B.$$

Since the computational cost for simulating such large circuits is indeed tremendously huge, model-order reduction techniques have been proposed recently to reduce the computational complexity, for example, U.S. Pat. No. 5,313,398, U.S. Pat. No. 5,379,231, U.S. Pat. No. 5,537,329, U.S. Pat. No. 5,689,685, U.S. Pat. No. 5,920,484, U.S. Pat. No. 6,023,573, U.S. Pat. No. 6,041,170. Among these ways, the moment matching techniques based on Pade approximation and Krylov subspace projections take advantage of efficiency and numerical stability.

'Moment' can be defined as follows. By expanding Y(s) about a frequency $s_0 \in C$, we have $$Y(s) = \sum_{i=-\infty}^{\infty} Y^{(i)}(s_0)(s-s_0)^i = \sum_{i=-\infty}^{\infty} B^T X^{(i)}(s_0)(s-s_0)^i,$$

where $$X^{(i)}(s_0)=(-(N+s_0M)^{-1}M)^i(N+s_0M)^{-1}B$$

is the i th-order system moment of X(s) about $s_0$ and $Y^{(i)}(s_0)$ is the corresponding output moment. Similarly, the i th-order system moment of $X_a(s)$ about $s_0$, $$X_a^{(i)}(s_0)=(-(N^T+s_0M)^{-1}M)^i(N^T+s_0M)^{-1}B,$$

can be obtained.

In general, Krylov subspace projection methods can be divided into two categories: one-sided projection methods and two-sided projection methods. The one-sided projection methods use the congruence transformation to generate passive reduced-order models while the two-sided ones can not be guaranteed.

The one-sided projection method for moment matching to generate a reduced-order network of Eq. (1) is described as follows. First, a congruence transformation matrix $V_q$ can be generated by the Krylov subspace methods. Let $A=-(N+s_0M)^{-1}M$ and $R=(N+s_0M)^{-1}B$. The k th-order block Krylov subspace generated by A and R is defined as $$K(A,R,k)=\text{colsp}\{R,AR,\ldots,A^{k-1}R\}=\text{colsp}(V_q), \qquad (3)$$

where $q \leq km$. $\text{colsp}(V_q)$ represents span the vector space by columns of matrix $V_q$. The Krylov subspace K(A,R,k) is then equal to the subspace spanned by system moments $X^{(i)}(s_0)$ for $i=0,1,\ldots,k-1$. Matrix $V_q$ can be iteratively generated by the block Arnoldi algorithm and thus be an orthonormal matrix. Next, by applying $V_q$, n-dimensional state space can be projected onto a q-dimensional space, where q<<n: $x(t)=V_q \hat{x}(t)$. Then the reduced-order model can be calculated as $$\hat{M}=V_q^T M V_q, \hat{N}=V_q^T N V_q, \hat{B}=V_q^T B. \qquad (4)$$

The transfer function of the reduced network is $$\hat{Y}(s)=\hat{B}^T(\hat{N}+s\hat{M})^{-1}\hat{B}.$$

The corresponding i th-order output moment about $s_0$ is $$\hat{Y}^{(i)}=\hat{B}^T(-(\hat{N}+s_0\hat{M})^{-1}\hat{M})^i(\hat{N}+s_0\hat{M})^{-1}\hat{B}.$$

It can be shown that $Y^{(i)}(s_0)=\hat{Y}^{(i)}(s_0)$ for $i=0,1,\ldots,k-1$ and the reduced-order model is passive.

However, linear independence of the columns in the block Krylov sequence, $\{R,AR,\ldots,A^{k-1}R\}$, is lost only gradually in general. In addition, the orthogonalization process to generate matrix $V_q$ may be numerically ill-conditioned if the order k is extremely high. This invention will provide the adjoint network technique to overcome the above problem. Furthermore, the method will reduce the computational cost of constructing the projector.

SUMMARY OF THE INVENTION

This invention introduces an efficient technique to further reduce the computational cost of the one-sided projection methods. By exploring symmetric properties of the MNA formulation, we will show that the transfer functions and system moments of the adjoint network can be directly calculated from those of the original RLC network. The cost for constructing the congruence transformation matrix can be reduced by up to 50% of the previous methods. In addition, it will be shown that this can be directly applied to the sensitivity analysis of the original circuits, and to generate the congruence transformation matrices for the sensitivity analysis of the reduced-order system.

Further benefits and advantages of the present invention will become apparent after a careful reading of the detailed description with appropriate reference to the accompanying drawings.

DETAILED DESCRIPTION OF THE INVENTION

Figure 1:
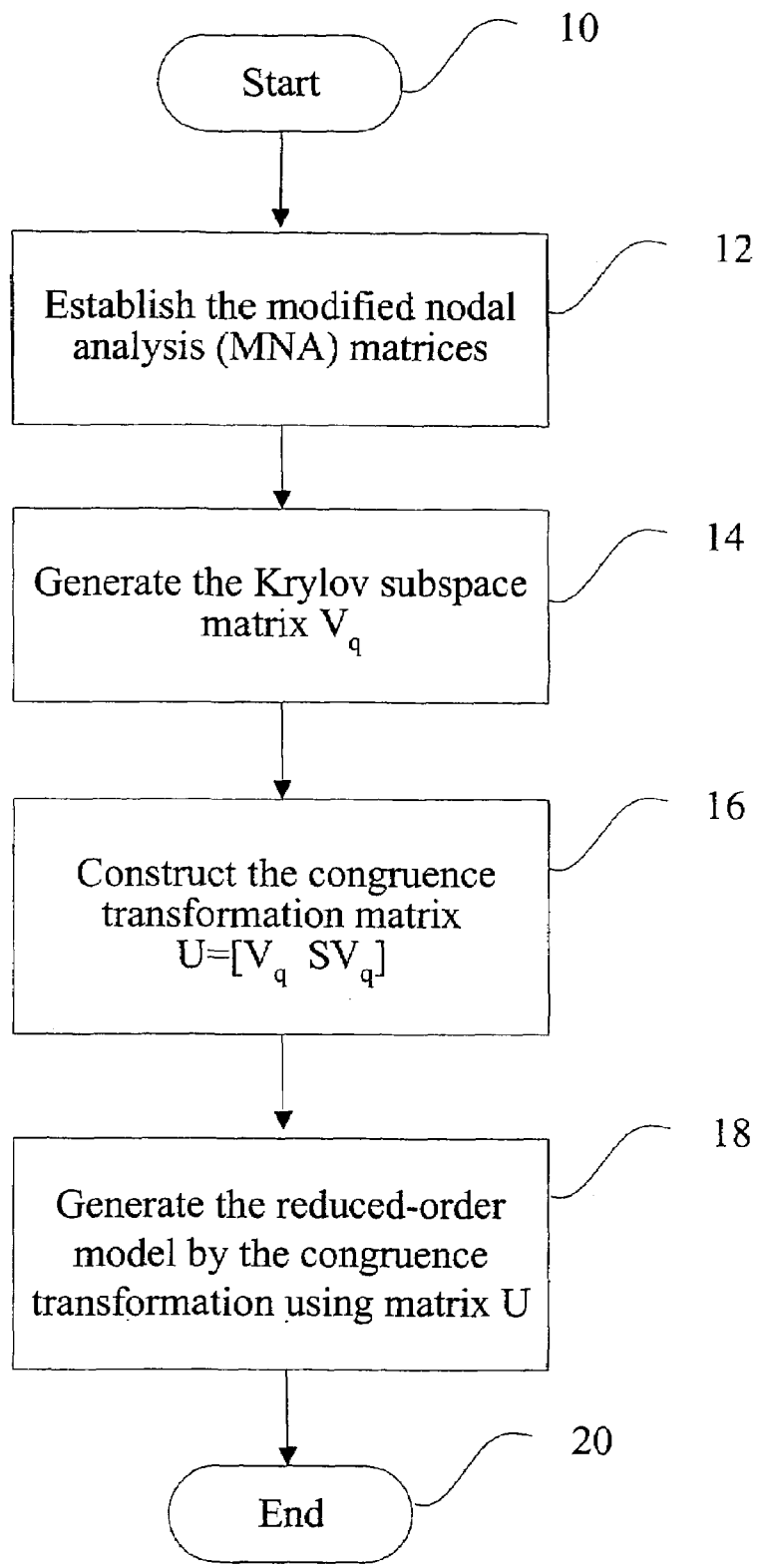
FIG. 1 is a flow chart of a method and apparatus for model-order reduction and sensitivity analysis in accordance with the present invention.

FIG. 1 illustrates the flow chart of this invention. Step 12 establishes the MNA matrices M, N, and B as in Eq. (1). Step 14 generates the Krylov matrix $V_q$, which spans the k th-order block Krylov subspace defined in Eq. (3). Step 16 constructs the congruence transformation matrix U by using matrix $V_q$, which will be stated infra. Step 18 generates the corresponding reduced-order models by applying the congruence transformation technique with matrix U as in Eq. (4).

Frequency Response of Adjoint Networks

Suppose that nv and ni are the dimension of the node voltages and the branch currents in x(t). Let each port be connected with a current source so that $B^T=[B_v^T\ 0]$, where $B_v \in R^{nv \times m}$. Let the signature matrix S be defined as $S=\text{diag}(I_{nv}, -I_{ni})$, where I represents an identity matrix. The symmetric properties of the MNA matrices are as follows:

$$S^{-1}=S,\ SMS=M,\ SNS=N^T,\ SB=B \quad (5)$$

If port impedance parameters are concerned, each port is connected with a voltage source and thus $B^T=[0\ B_i^T]$, where $B_i \in R^{ni \times m}$. To preserve the properties in Eq. (3), then $\bar{S}=\text{diag}(-I_{nv}, I_{ni})$ will be used. If port transmission parameters are concerned, $B^T=[B_v^T\ B_i^T]$, the properties in Eq. (5) can still be preserved using superposition principles. The relationship between the transfer functions of the original system X(s) and those of the adjoint network $X_a(s)$ can be derived as follows:

$$\begin{aligned}X_a^{(i)}(s_0) &= -(N^T+s_0M)^{-1}MX_a^{(i-1)}(s_0) \\ &= -[S(N+s_0M)S]^{-1}SMSSX^{(i-1)}(s_0) \\ &= S[-(N+s_0M)^{-1}MX^{(i-1)}(s_0)] \\ &= SX^{(i)}(s_0)\end{aligned} \quad (6)$$

Thus $X_a(S)$ can also be calculated from X(s) directly.

Reduced-Order Models Based on Projection

If matrix U is chosen as the congruence transformation matrix such that $$\{X^{(i)}(s_0), X_a^{(j)}(s_0)\} \in \text{colsp}(U),\ 0 \leq i \leq k,\ 0 \leq j \leq l. \quad (7)$$

Then, $\hat{Y}^{(i)}(s_0)=Y^{(i)}(s_0)$, $0 \leq i \leq k+l+1$. The reduced-order transfer function satisfies $\hat{Y}(s)=Y(s)+O(s-s_0)^{K+l+2}$. In particular, if matrix U is built only from $X^{(i)}(s_0)$ with no component from $X_a^{(j)}(s_0)$, then $\hat{Y}^{(i)}(s_0)=Y^{(i)}(s_0)$, $0 \leq i \leq k$. Although Eq. (4) can overcome the numerical instability problem when generating the basis matrix U if order k+l+1 is extremely high, $X_a^{(j)}(s_0)$ and $X^{(i)}(s_0)$ still need to be calculated individually for general RLC networks. The computational cost of generating U can not be reduced.

This invention provides the adjoint network method to reduce the computational cost of constructing the projector U as follows. Suppose that $X^{(i)}(s_0) \in \text{colsp}(V_q)$ for $0 \leq i \leq k-1$ is a set of moments of X(s) about $s_0$. Then, it can be shown that $X_a^{(i)}(s_0) \in \text{colsp}(SV_q)$ for $0 \leq i \leq k-1$. $V_q$ is the orthonormal matrix generated iteratively by the block Arnoldi algorithm. Let $U=[V_q\ SV_q]$ be the congruence transformation matrix for model-order reductions. Therefore, moment $Y^{(i)}(s_0)$ can be matched up to (2k-1)st-order by applying the congruence transformation matrix, that is, $$\hat{Y}^{(i)}(s_0)=Y^{(i)}(s_0),\ \text{for}\ 0 \leq i \leq 2k-1 \quad (8)$$

Sensitivity Analysis

We can also apply $X_a(s)=SX(s)$ to perform the sensitivity analysis. If the sensitivity of the output Y(s) with respect to one circuit parameter λ is concerned, we have $$\frac{\partial Y(s)}{\partial \lambda} = -X_a^T(s)\frac{\partial(N+sM)}{\partial \lambda}X(s) \quad (9)$$

Substituting the symmetrical property $X_a(s)=SX(s)$ into Eq. (9), we get $$\frac{\partial Y(s)}{\partial \lambda} = -X^T(s)S\frac{\partial(N+sM)}{\partial \lambda}X(s) \quad (10)$$

Thus the computational cost of sensitivity analysis can be reduced about 50% by only solving x(s).

Although we can perform the sensitivity analysis of the original network using Eq. (10) it is advisable to perform the sensitivity analysis by applying the model-order reduction techniques. In the previous works, the congruent transformation matrices V and $V_a$ such that $X^{(i)}(s_0) \in V$ and $X_a^{(i)}(s_0) \in V_a$ for $0 \leq i \leq k-1$ are constructed individually, with $V=SV_a$. The proposed sensitivity analysis includes the following steps:

(1) calculate the congruence transformation matrix $U=[V_{q/2}\ SV_{q/2}]$;

(2) generate the reduced order systems $\{\hat{M}, \hat{N}, \hat{B}\}$ through the congruence transformation Eq. (4);

(3) solve $(\hat{N}+s\hat{M})\hat{X}(s)=\hat{B}$ for each frequency s; and (4) map $\hat{X}(s)$ back to the original and adjoint state spaces X(s) and SX(s).

Experimental Results

Figure 2:
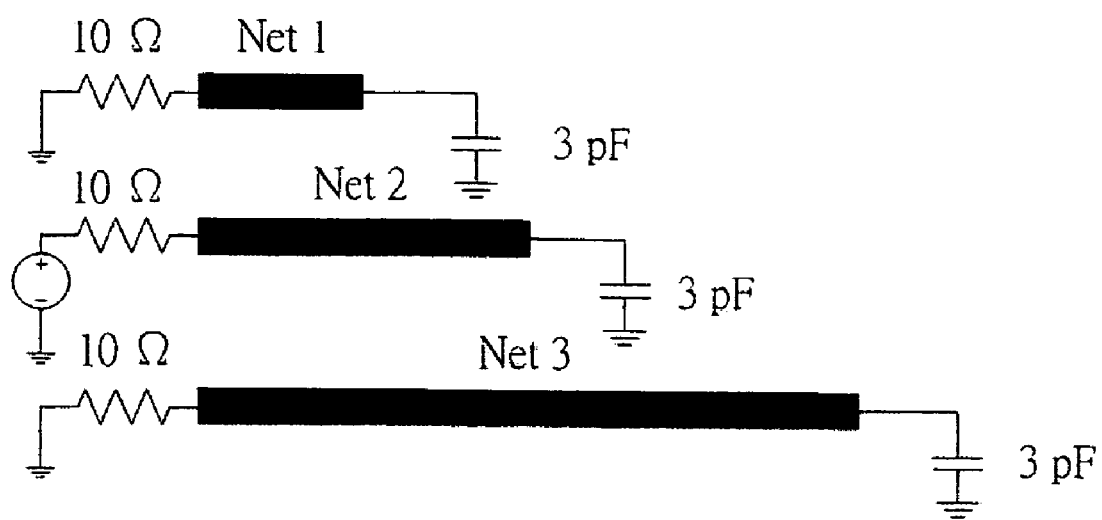
FIG. 2 is a couple tree-line circuit of the present invention.
Figure 3:
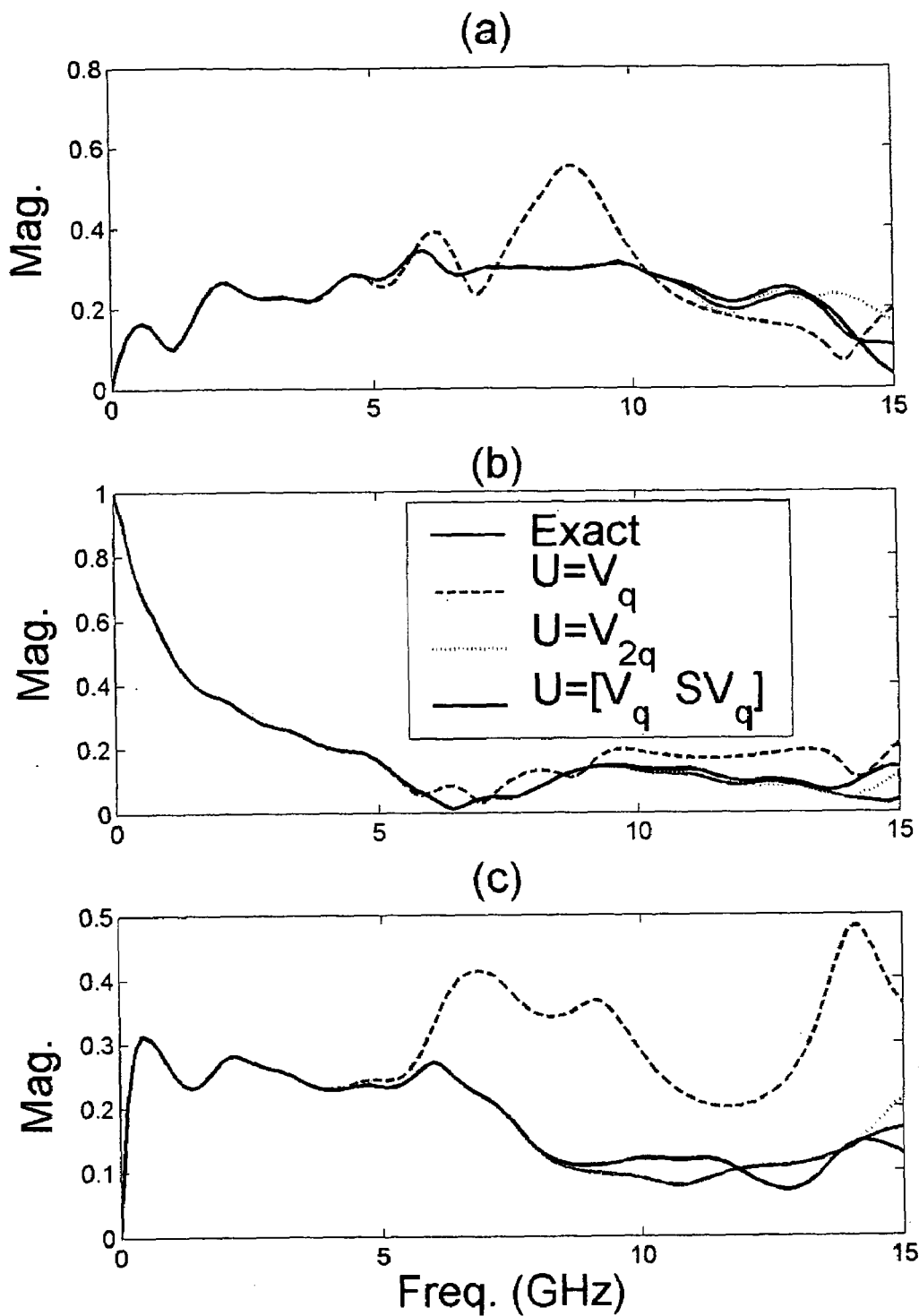
FIG. 3 shows transfer functions of the far end of the aggressor net and the victim nets: (a) Net 1, (b) Net 2 and (c) Net 3.

We provide an example, a coupled three-line circuit in FIG. 2, to show the efficiency of the proposed method. The line parameters are resistance: 3.5 Ω/cm, capacitance: 5.16 μF/cm, inductance: 3.47 nH/cm, coupling capacitance: 6 μF/cm and mutual inductance: 3.47 nH/cm. Nets 1, 2, and 3 are divided into 50, 100 and 150 sections, respectively. The dimension of the MNA matrices is 600×600 and the number of ports is 4. Suppose that the block Arnoldi algorithm is chosen to generate the orthonormal basis for the corresponding Krylov subspace during the whole experiment. We set shift frequency $s_0=1$ GHz and iteration number k=10. So q=40. The frequency responses of the original model and the reduced-order model generated by the block Arnoldi algorithm with the congruence transformation matrices $U=V_q$, $U=V_{2q}$, and $U=[V_q\ SV_q]$ are illustrated in FIG. 3. The time to generate the reduced-order models are with $U=V_q$: 1.50s, $U=V_{2q}$: 3.86s, and the proposed $U=[V_q \, SV_q]$: 2.02s by using Matlab 6.1 with Pentium II 450 MHz CPU and 128 MB DRAM.

Figure 4:
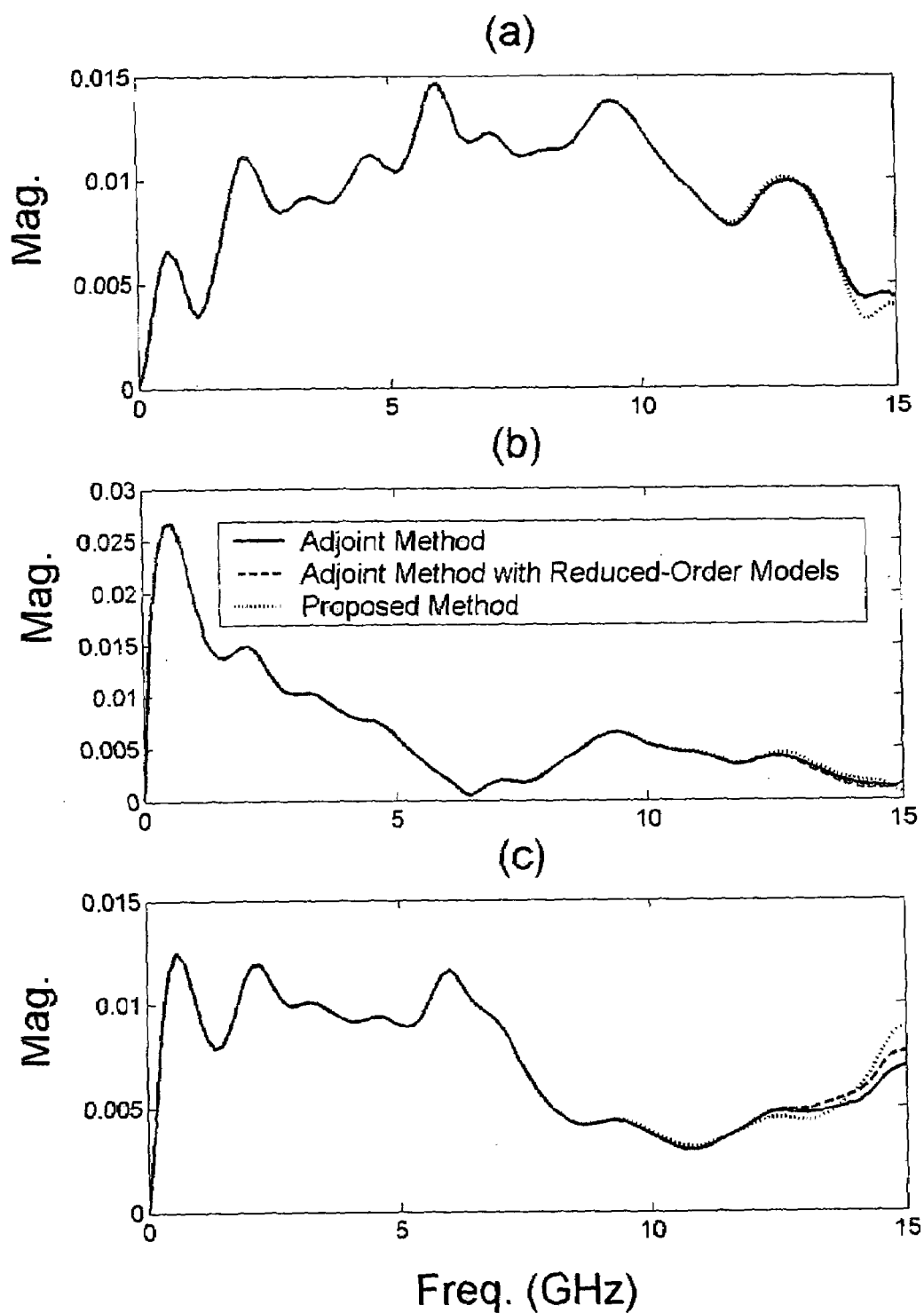
FIG. 4 shows sensitivity analysis of the far end of the aggressor net and the victim nets: (a) Net 1, (b) Net 2 and (c) Net 3.

In addition, sensitivity analysis results are also compared. We choose $\lambda$ to be the effective driver impedance at the near end of the aggressor net and total 101 frequency points ranged from 0 to 15 GHz to be simulated. The results are generated by the traditional adjoint method, the adjoint method with the 24th-order reduced-order models, and the proposed method are compared in FIG. 4. The simulation time of these models are 555.36s, 24.55s, and 14.15s, respectively. Therefore, it can be observed that the proposed method shows pretty good approximate results and takes less time.

Conclusions

An efficient model-order reduction technique for general RLC networks has been proposed in this invention. Extending the traditional projection method with considering both the original system and the adjoint network, the proposed method only needs to use one half of the original moment information by exploring symmetric properties of the MNA formulation. In addition, moment matching and passivity are preserved. Sensitivity analysis also can be efficiently calculated. Experimental results have demonstrated the accuracy and the efficiency of the proposal method.

Although the invention has been explained in relation to its preferred embodiment, it is to be understood that many other possible modifications and variations can be made without departing from the spirit and scope of the invention as hereinafter claimed.

What is claimed is:

1. A method of model-order reduction for RLC circuits in very large scale integration of interconnection circuits using one sided projection comprising:
   modeling a circuit by entering circuit RLC parameters into a modulated node analysis matrix;
   generating a module reduction circuit replacing the model circuit, by use of a modularized simplification with a Krylov subspace matrix;
   constructing a congruence transformation matrix from the module reduction circuit; and
   generating a reduced order model of the congruence transformation matrix by applying a congruence transformation; by
   using a frequency response adjoint network to eliminate symmetries in the congruence transformation matrix to reduce calculations required.

2. A method of model-order reduction for RLC circuits in very large scale integration of interconnection circuits using one sided projection as in claim 1 further comprising performing a sensitivity analysis of the reduced order model.

3. A method of model-order reduction for RLC circuits in very large scale integration of interconnection circuits using one sided projection as in claim 2 further comprising:
   reducing a size of the congruence transformation matrix by use of symmetrical properties of the congruence transformation matrix to reduce calculations required for sensitivity analysis.

4. A method of model-order reduction for RLC circuits in very large scale integration of interconnection circuits using one sided projection as in claim 1 further comprising:
   performing a sensitivity analysis reduced order system by:
   calculating the congruence transformation matrix,
   generating a reduced order system through congruence transformation of the congruence transformation matrix,
   solving the reduced order system for each frequency, and
   mapping results of the solved reduced order system.

5. A method of model-order reduction for RLC circuits in very large scale integration of interconnection circuits using one sided projection as in claim 1 further comprising:
   generating the congruence transformation matrix by a block Arnoldi algorithm to produce an orthonormal matrix.

6. A method of model-order reduction for RLC circuits in very large scale integration of interconnection circuits using one sided projection as in claim 5 further comprising performing a sensitivity analysis of the reduced order model.

7. A method of model-order reduction for RLC circuits in very large scale integration of interconnection circuits using one sided projection as in claim 6 further comprising:
   reducing a size of the congruence transformation matrix by use of symmetrical properties of the congruence transformation matrix to reduce calculations required for sensitivity analysis.

8. A method of model-order reduction for RLC circuits in very large scale integration of interconnection circuits using one sided projection as in claim 5 further comprising:
   performing a sensitivity analysis reduced order system by:
   calculating the congruence transformation matrix,
   generating a reduced order system through congruence transformation of the congruence transformation matrix,
   solving the reduced order system for each frequency,
   mapping results of the solved reduced order system.

9. A method of model-order reduction for RLC circuits in very large scale integration of interconnection circuits using one sided projection as in claim 5 further comprising:
   reducing a size of the congruence transformation matrix by use of symmetrical properties of the congruence transformation matrix to reduce calculations required for sensitivity analysis.

* * * * *